United States Patent [19]

Tasaka

[11] Patent Number: 5,561,078
[45] Date of Patent: Oct. 1, 1996

[54] METHOD OF FABRICATION OF SEMICONDUCTOR DEVICE

[75] Inventor: Kazuhiro Tasaka, Tokyo, Japan

[73] Assignee: NEC Corporation, Tokyo, Japan

[21] Appl. No.: 28,533

[22] Filed: Mar. 8, 1993

[30] Foreign Application Priority Data

Mar. 9, 1992 [JP] Japan .................. 4-050225

[51] Int. Cl.⁶ .................................................. H01L 21/76
[52] U.S. Cl. ..................... 437/67; 148/DIG. 50
[58] Field of Search ............. 437/67, 228; 148/DIG. 85, 148/DIG. 86, DIG. 50

[56] References Cited

U.S. PATENT DOCUMENTS

| | | | |
|---|---|---|---|
| 4,740,480 | 4/1988 | Ooka | 437/67 |
| 5,229,316 | 7/1993 | Lee et al. | 148/DIG. 50 |
| 5,231,046 | 3/1993 | Tasaka | 437/228 |
| 5,234,861 | 8/1993 | Roisen et al. | 437/67 |

FOREIGN PATENT DOCUMENTS 5-226466  9/1993  Japan ...................... 437/67

OTHER PUBLICATIONS

IBM Technical Disclosure Bulletin, vol. 32, No. 10A Mar. 1990 p.90.
Wolf, Silican Processing for the VLSI vol. 2—Processing Integration pp. 208–214, Lattice Press 1986.

Primary Examiner—Tom Thomas
Assistant Examiner—S. Mulpuri
Attorney, Agent, or Firm—Popham, Haik, Schnobrich & Kaufman, Ltd.

[57] ABSTRACT

A method of fabricating a semiconductor device incorporates the steps of forming in succession a gate insulting film, a polycrystalline silicon film and a first insulating film on a semiconductor substrate surface, and etching a portion of the first insulating film, the polycrystalline silicon film and the gate insulating film to expose the semiconductor substrate. The exposed semiconductor substrate is etched to form a trench. The trench is then buried by depositing a second insulating film and thereafter a third insulating film. The second and third insulating films are then etched with the third insulating film being etched at a higher rate than the second insulating film. The polycrystalline silicon film is used as a stopper to leave behind the second and third insulating films in the trench. A fourth insulating film is deposited, and then etched again using the polycrystalline silicon film as a stopper. The side walls of the trench are thus coated with the fourth insulating film. Lastly, a gate electrode is formed by depositing a conductive film and selectively removing the conductive film and the polycrystalline silicon film.

2 Claims, 3 Drawing Sheets

METHOD OF FABRICATION OF SEMICONDUCTOR DEVICE

BACKGROUND OF THE INVENTION

1. Field of the Invention

This invention relates to a method of fabrication of a semiconductor device, and more particularly to a method of formation of isolation trenches in a very small semiconductor device of a submicron size.

2. Description of the Prior Art

One of the prior art methods of formation of an isolation trench in a semiconductor device is described with reference to FIG. 1A to 1E.

As illustrated in FIG. 1A, a thick gate oxide film 2 of about 10–25 nm is first formed on an area of a P-type silicon substrate 1 including a memory cell formation area. In succession, an entire substrate is coated as a first insulating film with a thick silicon oxide film of about 100–150 nm for example. Then, a 0.4–0.6 µm wide opening is formed using a resist film 5 only at a portion where a device isolation scheduled area 6 is formed. A first insulating film 4, a polycrystalline silicon film 3, and a gate oxide film 2 are anisotropically etched successively to selectively expose a P-type silicon substrate 1. Then, after the resist film 5 is removed as illustrated in FIG. 1B, etching is carried out with the first insulating film 4 taken as a mask to form a 0.5–1.5µm deep trench 7. Further, as illustrated in FIG. 1C, a non-doped silicon oxide film (second insulating film 8) for example, which is shown in a dry etching rate than a third insulating film to be formed later such as a BPSG, is deposited into an about 100–200 nm thickness, and in succession a BPSG film (borophospho silicate glass film) for example as the third insulating film 9 is deposited into a 1.0–2.0 µm thickness, in order to completely bury the trench, which BPSG film is in turn re-flowed by an approximately 850°–950° C. heat treatment to complete the trench and simultaneously flatten the surface. Successively, as illustrated in FIG. 1D, etching-back is applied using the polycrystalline silicon film 8 as a stopper. The etching-back ideally being completed as the top surface of the insulating film 9 is coincident with the top surface of the polycrystalline silicon film 3 as the stopper. Over-etching is however likely to occur owing to the difficulty in controlling the etching-back, which can produce an indentation 10. The indentation 10 is however through the third insulating film 9, and the second insulating film 8 is etched more slowly than the third insulating film 9, and hence in the worst case the etching-back is terminated above the gate oxide film 2. The substrate is prevented from being exposed along the sides of the trench.

Further, as illustrated in FIG. 1E, a silicide wiring 11 is formed by depositing a tungsten silicide film over the entire surface of the semiconductor substrate and selectively removing part of the same, and a source-drain region is formed by ion doping. A MOS transistor is successfully formed which includes a device isolation trench 7A and a polycide gate electrode formed in a self-alignment manner to the former.

In the prior art method of forming the device isolation trench, the third insulating film 9 is unlikely to be controlled in the uniformity thereof in a wafer surface addditionally to the difficulty of the control of the etching-back, and hence variations of the thickness of the third insulating film 9 sometimes amount to about 10%.

Accordingly, deposition of the film 9 of even 1.3 µm causes a film thickness difference in the wafer surface to become 130 nm, and an indentation to completely etch back the film 9 in the wafer surface causes overetching depending upon the location thereof in the wafer surface. Thereupon, provided the etching-back is carried out at a location of the third insulating film 9 where it is originally thinner, the second insulating film might also be overetched to expose the substrate. This might produce short-circuitting of the silicide wiring with the conductive film lowering the yield of the semiconductor device.

SUMMARY OF THE INVENTION

The present invention has been made in view of the foregoing circumstances. Its object is to provide a method of fabricating a semiconductor device which is capable of preventing a substrate from being exposed along the side of a trench for stabilization of the yield. This is done in connection with forming a trench type device isolation region in a self-alignment manner with respect to a gate electrode, and melting and burying an oxide film.

To achieve the above object, according to an aspect of the present invention, there is provided a method of fabricating a semiconductor device, comprising the steps of; forming in succession a gate insulating film, a polycrystalline silicon film, and a first insulating film on a semiconductor substrate surface; forming a trench by etching a predetermined portion of the first insulating film, the polycrystalline silicon film, and the gate insulating film and further etching the semiconductor substrate in a self-alignment manner to the first insulating film; burying the trench by depositing a second insulating film and thereafter depositing a third insulating film having a higher etching rate than the second insulating film; etching back using the polycrystalline silicon film as a stopper to leave behind the second and third insulating films in the trench; depositing a fourth insulating film; forming a device isolation trench buried with an insulator by etching using the polycrystalline silicon film as a stopper and coating the side walls of the trench with a fourth insulating film; and forming a gate electrode by depositing a conductive film and selectively removing the conductive film and the polycrystalline silicon film.

In the aforementioned method, the third insulating film comprises borophophosilicate glass.

In accordance with the aforementioned aspect of the present invention, after the trench is formed, the first and third insulating films (the second insulating film being directly deposited on the trench is comparative with or slower than the third insulating film in the etching rate of the etching-back) are deposited for the next etching-back process. Even if in this step the etching-back is excessive, the exposure of the substrate on the side of the trench sides can be prevented because of the existence of the second and third insulating films. However since the uniformity of the third insulating film in the wafer surface with which the trench is completely buried is poor, the substrate might also be partly exposed depending upon locations in the wafer surface if it is left behind as is, thereby resulting in the poor yield. To solve this, a fourth insulating film is deposited anew for the etching-back to form a side wall film on the top part of the trench, whereby any exposed portion of the substrate and other portions are reinforced to completely prevent the substrate from being exposed. Thus, short-circuiting between the conductive film and the substrate can be eliminated and the device isolation trench can stably be formed for improvement of the yield of the semiconductor device.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF THE INVENTION

Figure 1A:
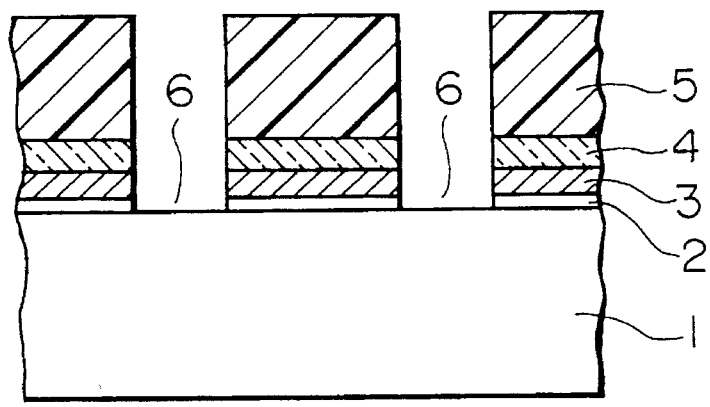
FIGS. 1A through 1E are exemplary sectional views each illustrating the prior art method of fabricating a semiconductor device in the order of steps.
Figure 1B:
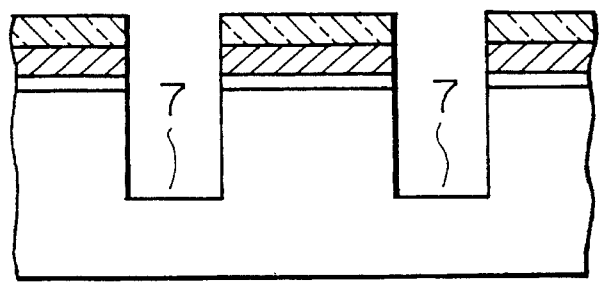
Figure 1C:
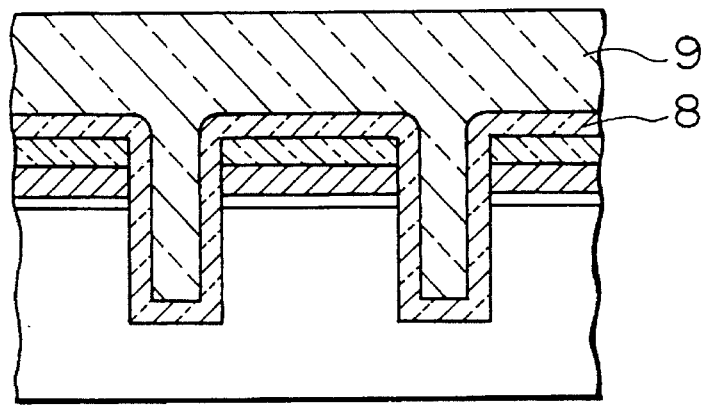
Figure 1D:
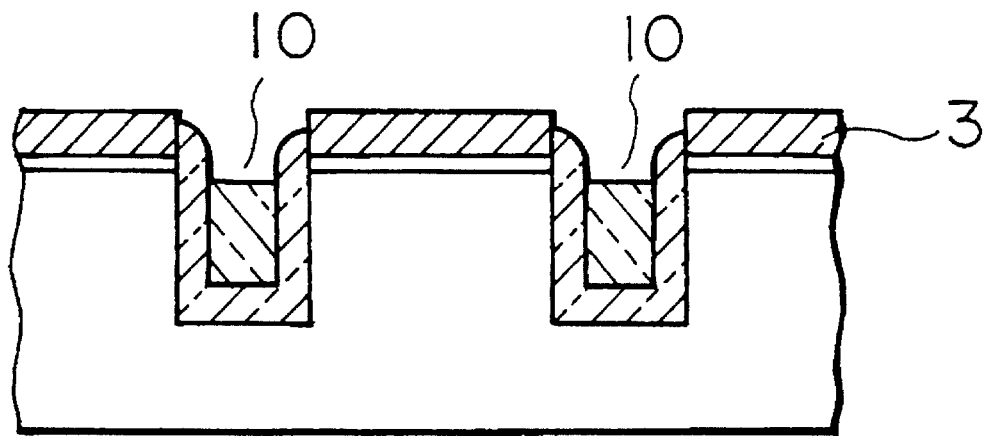
Figure 1E:
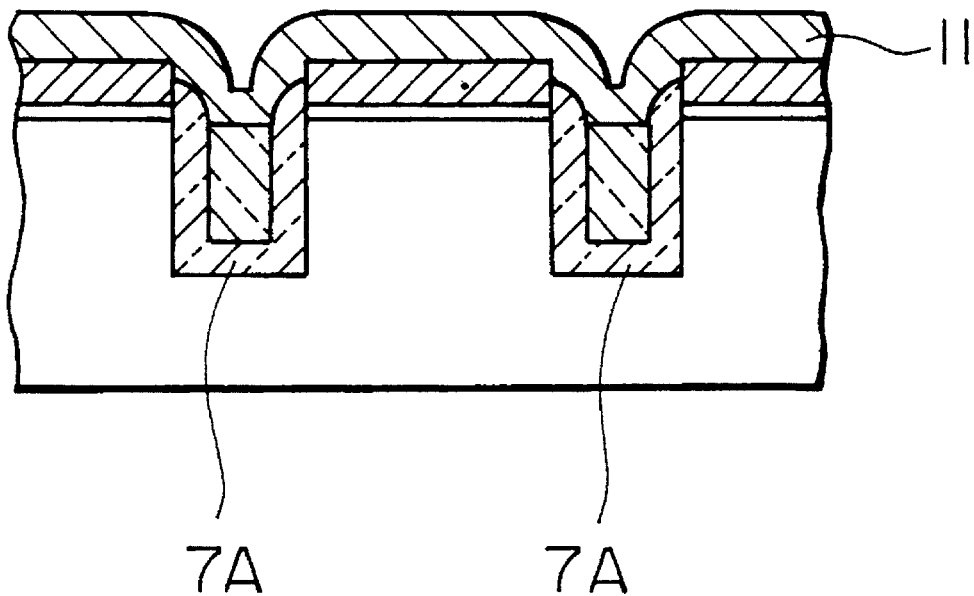
Figure 2A:
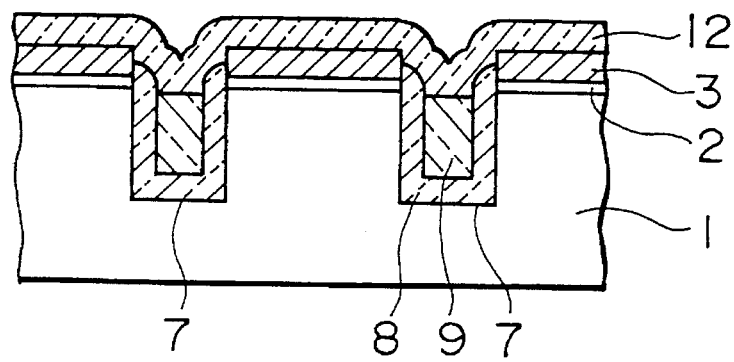
FIGS. 2A through 2C are identical views each illustrating a method of a semiconductor device according to the present invention in the order of its steps.
Figure 2B:
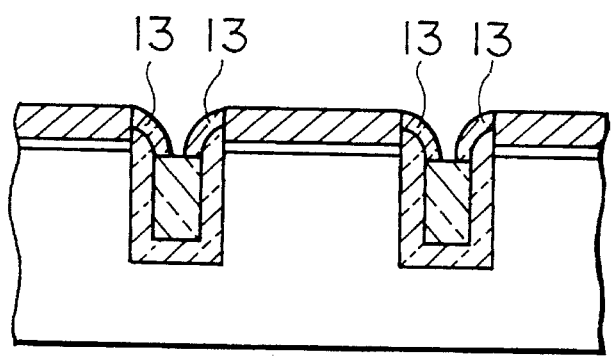
Figure 2C:
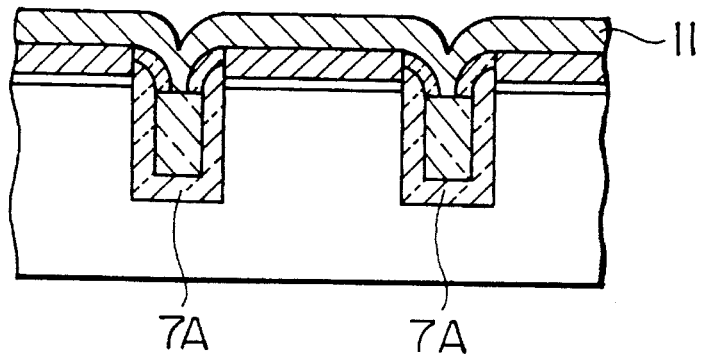

In what follows, a preferred embodiment of the present invention will be decsribed with reference to FIGS. 2A through 2C.

Similar to the foregoing prior art example, a trench is first buried with a silicon oxide film, and as illustrated in FIG.2A an about 200–300 nm thick non-doped silicon oxide for example as a fourth insulating film 12 is deposited to bury an indentation 10 (refer to FIG. D). In succession, the resulting fourth insulating film 12 etching-back is applied using also the polycrystalline silicon film 3 as a stopper, and hereby a side wall film 13 comprising the fourth insulating film 12 is formed on the upper portion of the trench as illustrated in FIG. 2B. With the aid of the side wall film, any portion of the substrate exposed owing to the foregoing overetching as well as other portions are reinforced to improve the yield of the entire wafer.

Further, as illustrated in FIG. 2C, a tungsten silicide film is deposited over the entire surface of the wafer and in turn selectively removed to form a silicide wiring 11. Further a source-drain region is formed by ion doping. Hereby, a MOS transistor is successfully formed which possesses a polycide gate electrode formed in a self-alignment manner to a device isolation trench 7A.

What is claimed is:

1. A method of fabricating a semiconductor device comprising the steps of:

(a) forming a gate insulating film, a polycrystalline silicon film, and a first insulating film in succession on a semiconductor substrate surface;

(b) etching portions of said first insulating film, said polycrystalline silicon film, and said gate insulating film to selectively expose said semiconductor substrate, and further etching said selectively exposed semiconductor substrate to form a trench;

(c) depositing a second insulating film and then depositing a third insulating film to bury said trench;

(d) etching-back the third insulating film at a higher rate than said second insulating film using said polycrystalline silicon film as a stopper to leave behind said second and third insulating films in said trench;

(e) depositing a fourth insulating film over entire said semiconductor substrate;

(f) etching the fourth insulating film using said polycrystalline silicon film as a stopper to form a side wall film on the top part of said trench with the fourth insulating film; and (g) depositing a conductive film and selectively removing said conductive film and said polycrystalline silicon film to form a gate electrode.

2. A method of fabrication of a semiconductor device according to claim 1 wherein said third insulating film is a borophospho silicate glass film.

\* \* \* \* \*